US008351543B2

(12) United States Patent
Kenington

(10) Patent No.: US 8,351,543 B2
(45) Date of Patent: Jan. 8, 2013

(54) ACTIVE ANTENNA ARRAY WITH MODULATOR-BASED PRE-DISTORTION

(75) Inventor: Peter Kenington, Chepstow (GB)

(73) Assignee: Ubidyne, Inc., Wilmington, DE (US)

( * ) Notice: Subject to any disclaimer, the term of this patent is extended or adjusted under 35 U.S.C. 154(b) by 574 days.

(21) Appl. No.: 12/643,544

(22) Filed: Dec. 21, 2009

(65) Prior Publication Data

US 2011/0150130 A1     Jun. 23, 2011

(51) Int. Cl.
    *H04L 25/03*    (2006.01)
(52) U.S. Cl. ........ 375/296; 375/295; 375/297; 375/299; 375/267; 375/347; 375/349; 375/262; 375/259; 375/260; 375/261
(58) Field of Classification Search .................. 375/316, 375/267, 347, 349, 262, 259, 260, 261
    See application file for complete search history.

(56) References Cited

U.S. PATENT DOCUMENTS

| | | | | |
|---|---|---|---|---|
| 5,852,630 | A * | 12/1998 | Langberg et al. | 375/219 |
| 6,697,436 | B1 * | 2/2004 | Wright et al. | 375/296 |
| 6,956,433 | B2 | 10/2005 | Kim et al. | |
| 6,993,301 | B1 | 1/2006 | Kenington et al. | |
| 7,058,369 | B1 | 6/2006 | Wright et al. | |
| 7,146,144 | B2 * | 12/2006 | Robinson et al. | 455/260 |
| 2002/0097811 | A1 * | 7/2002 | Kubo et al. | 375/296 |
| 2003/0179829 | A1 * | 9/2003 | Pinckley et al. | 375/295 |
| 2003/0202614 | A1 * | 10/2003 | Braithwaite | 375/296 |
| 2005/0127995 | A1 * | 6/2005 | Domokos | 330/149 |
| 2009/0146736 | A1 | 6/2009 | Kim et al. | |
| 2010/0008446 | A1 * | 1/2010 | Netsell et al. | 375/296 |

FOREIGN PATENT DOCUMENTS

| | | |
|---|---|---|
| EP | 1280273 | 1/2003 |
| WO | 01/08294 | 2/2001 |
| WO | 2004/077660 | 9/2004 |

OTHER PUBLICATIONS

International Preliminary Report issued in PCT/EP10/70114 on Jul. 5, 2012.
International Search Report & Written Opinion issued in International Patent Application No. PCT/EP10/70114 on Mar. 15, 2011, 11 pages.

* cited by examiner

*Primary Examiner* — Siu Lee
(74) *Attorney, Agent, or Firm* — Stephen H. Eland; Dann, Dorfman, Herrell & Skillman

(57) ABSTRACT

An active antenna array comprises a plurality of transmission paths, a predistortion modulation signal generator, and a predistortion modulation signal distribution structure. At least two of the plurality of transmission paths comprise a predistortion modulator for modulating a transmission path signal with a predistortion modulation signal generated by the predistortion modulation signal generator and distributed by predistortion modulation signal distribution structure to the at least two of the plurality of transmission paths. A method for predistorting at least two of a plurality of transmission path signals in an active antenna array and computer program products for manufacture and method execution are also claimed.

19 Claims, 8 Drawing Sheets

ACTIVE ANTENNA ARRAY WITH MODULATOR-BASED PRE-DISTORTION

FIELD OF THE INVENTION

The field of the present invention relates to transmitter linearisation in an active antenna array. The field of the present invention further relates to a method for predistorting transmission path signals in an active antenna array.

BACKGROUND OF THE INVENTION

Modern communication standards sometimes require linear power amplification in contrast to, for example, frequency-modulation (FM) based systems for which highly non-linear transmitters and receivers were sufficient. Modern mobile communications standards such as UMTS, WiMAX and Long Term Evolution (LTE) are also intended to support a variety of different channel coding and modulation techniques (CDMA, OFDM, etc.), broader channel bandwidths and high peak-to-average power ratio (PAPR) modulation schemes. Moreover, there is an increasing demand for base stations supporting a wider range of frequency bands. Such base stations are more flexible and may be reconfigured if new frequency slots become available or a frequency slot gets assigned to a new communications standard, such as UMTS.

These developments place a high demand on the power amplifiers in the base transceiver station, in particular, with respect to linearity and bandwidth.

One approach to achieve good linearity in a transmitter is to digitally predistort a base band signal to achieve transmitter linearization in mobile radio infrastructure systems. Base band digital predistortion works well, but can prove to be costly to implement in a multi-element antenna-embedded radio application, due to the large number of predistorters required and the need to transmit high-bandwidth data to each transmitter. The data has a high bandwidth because the data must include the predistortion bandwidth and not just the wanted signal bandwidth. This latter problem, in particular, makes it difficult to achieve a wide transmission bandwidth with delta-sigma converters, whilst still maintaining the required signal-to-noise ratio in the output signal.

The International Application Publication WO 01/08294 A1 entitled "Transmission antenna array system with predistortion" assigned to Datum Telegraphic, Inc., discloses a transmission antenna array system comprising a plurality of amplification chains and a plurality of compensation circuits. A processing unit monitors input transmission signals and corresponding output signals of the plurality of amplification chains. The processing unit processes the input signals and the output signals to adaptively generate updates to the compensation parameters used by each of the plurality of compensation circuits. The compensation circuits are configured to digitally predistort the input transmission signal using a dynamically updated set of the compensation parameters.

U.S. Pat. No. 6,993,301 B1 in the name of Kenington et al., assigned to Andrew Corporation, is entitled "Lineariser for a signal handling apparatus". The lineariser for reproducing distortion present in the output of an amplifier (or other signal handling device) generates a predistortion signal from an input to an amplifier. The predistortion signal is mixed into the amplifier input signal using, for example, a vector modulator. The predistortion signal may be derived in a quadrature format, to enable orthogonal components of the predistortion signal to be mixed into separate mixers of the vector modulator. The predistortion signal is generated digitally using a digital signal processor (DSP). U.S. Pat. No. 6,993,301 B1 discloses the linearisation of a single transmission path but not of an active antenna array.

U.S. Patent Application Publication No. 2009/0146736 A1 entitled "Baseband-derived RF digital predistortion" in the name of Kim et al, assigned to Dani System Co. Ltd., discloses a similar arrangement.

SUMMARY OF THE INVENTION

The active antenna array of the current disclosure comprises a plurality of transmission paths, a predistortion modulation signal generator, and a predistortion modulation signal distribution structure. At least two of the plurality of transmission paths contain a predistortion modulator for modulating a transmission path signal with a predistortion modulation signal. The predistortion modulation signal distribution structure is adapted to receive the predistortion modulation signal from the predistortion modulation signal generator and to distribute the predistortion modulation signal to the predistortion modulator of the at least two of the plurality of transmission paths.

For the various transmission paths in an active antenna array it can often be assumed that a transmission path signal carried by a first transmission path of the plurality of transmission paths is similar to a second transmission path signal carried by a second transmission path of the plurality of transmission paths. This usually applies to several or even all transmission paths of the plurality of transmission paths. This similarity can be exploited for the purposes of transmission path linearisation because a predistortion action may be assumed to be substantially similar between one transmission path and another. Thus, a single predistortion modulation signal generator may serve several transmission paths by providing a common predistortion modulation signal to some or all of the paths.

The term "predistortion modulator" makes clear that a purpose of the element so-referenced is to predistort the transmission path signal of the corresponding transmission path, and that its functionality is based on a modulation of two signals, namely the transmission path signal and the predistortion modulation signal.

The predistortion modulation signal distribution structure should be suitable for distributing the predistortion modulation signal in a substantially unaltered manner To this end, the predistortion modulation signal distribution structure may need to meet certain specifications with respect to, for example bandwidth and dynamic range. This might add to the costs of the predistortion modulation signal distribution structure, or of components thereof such as digital-to-analogue converters. On the other hand, the transmission path signals feeding the transmit paths are now much narrower in bandwidth than they would be if baseband digital predistortion was also included in the signal spectra. There is usually a number of transmission paths in an active antenna array so that the higher costs for the predistortion modulation signal distribution structure are usually more than compensated by the savings effected by the option of using smaller bandwidth equipment in the transmission paths. For a single transmission path or in a conventional active antenna array, this advantage is diluted by the fact that the predistortion modulation signal generator and the predistortion modulation signal distribution structure is required once per transmission path, to supply the predistortion modulation signal(s) to the vector modulator(s). The teachings disclosed herein, however, are based on the insight that the signal being processed in at least two of the plurality of transmission paths are substantially identical (from a modulation perspective), with only RF carrier phase differences and/or absolute amplitude level differences (but not differences in the shape of the envelope) between the channels (to form/steer a beam radiated by an antenna array connected to the active antenna array or a part of the active antenna array). It is also recognized that power amplifiers in the plurality of transmission paths are nearly identical, having been fabricated from the same size/type of device or making use of integrated circuit power amplifiers of identical design and fabrication. The non-linearity characteristics of these power amplifiers are likely to be very similar and hence the same correction signals can be used for all of them. This reduces the number of components that are needed for implementing the predistortion modulation signal generator and the predistortion modulation distribution structure.

As mentioned above the bandwidth requirements for the transmission paths or at least a part of the transmission paths could be relaxed by processing the predistortion-related signal using dedicated circuitry aside from the plurality of transmission paths. The predistortion modulation signal may thus bypass some components in the plurality of transmission paths that are particularly sensitive to high bandwidth requirements, such as digital-to-analogue converters. The teachings disclosed herein may overcome bandwidth issues with delta-sigma modulators which could enable much wider bandwidths to be supported.

The predistortion modulator may be one of a vector modulator or a polar modulator. A vector modulation modulates a first signal with a second signal in a Cartesian representation, in particular by multiplying in-phase components I of the two signals and separately multiplying quadrature components Q of the two signals with each other. The in-phase multiplication product and the quadrature multiplication product may than be summed to produce a predistortion transmission path signal.

A polar modulator, in contrast, modulates an amplitude and a phase of the transmission path signal, using for example an amplitude modulation signal and a phase modulation signal.

At least two of the plurality of transmission paths may comprise an amplifier and the predistortion modulator may be situated upstream of the amplifier. Modern standards for mobile communications networks tend to have relatively strict linearity requirements for the transmitters. In a transmission path the (power) amplifier is usually one of the components that are critical in terms of non-linearity of the transmission path. Situating the predistortion modulator upstream of the amplifier allows the modulation of the transmission path signal with the predistortion modulation signal so that the predistortion modulation signal may compensate for the non-linear behavior of the amplifier.

The active antenna array may further comprise a feedback loop connected to an output of the plurality of transmission paths and to the predistortion modulation signal generator. The predistortion modulation signal generator thus receives a feedback signal which may allow the predistortion modulation signal generator to compare the feedback signal with an original transmission path signal. If the feedback signal and the original transmission path signal are highly similar or even identical, then a setting of the predistortion modulation signal generator is well chosen and the predistortion modulation signal effectively compensates for a non-linear behavior of the plurality of transmission paths. If the feedback signal does not substantially match the original transmission path signal, then an appropriate predistortion control unit or module may adjust the settings of the predistortion modulation signal generator in order to improve the compensation performance of the predistortion modulation signal. Sometimes, the active antenna array comprises a feedback loop already for other purposes, such as calibration of the active antenna array in terms of amplitude and/or phase of the plurality of transmission paths. The feedback loop may then be shared and the feedback signal may then be distributed, for example internally within a DSP, to the various units or modules requiring the feedback signal.

The feedback may comprise a merging unit connected to the output of the plurality of transmission paths and adapted to merge feedback signals from at least one of the plurality of transmission paths to a common feedback signal. The merging unit allows the monitoring of several or all transmission paths of the plurality of transmission paths without the need to provide a plurality of feedback loops, i.e. one feedback loop per transmission path to be monitored. The merging unit may be situated close to the output of the plurality of transmission paths so that only a single feedback loop is required between the merging unit and the predistortion modulation signal generator.

The merging unit may be one of an additive signal combiner, a selection switch, or a multiplexer. The additive signal combiner simply adds output signals available at the output of the plurality of transmission paths and provides a sum signal at its output. The additive signal combiner may be designed to implement a weighted sum of the output signals, for example to take output signals in the centre of the active antenna array more strongly into account than those towards the edges.

The merging unit may also be a selection switch comprising a plurality of input terminals and an output terminal The selection switch may connect one input terminal of the plurality of input terminals with the output terminal in response to a control signal. The control signal could be sent by the predistortion modulation signal generator or by another control unit. A multiplexer is another option for the merging unit. The multiplexer could forward the output signals of a plurality of transmission paths to the predistortion modulation signal generator, for example in a 'round-robin' manner. The multiplexer could be synchronized to the predistortion modulation signal generator for example by means of a clock signal. The multiplexer could also send tag signals when switching to a new transmission path whose output signal is to be forwarded to the predistortion modulation signal generator. The tag signals could indicate an identifier of the next output signal of the plurality of transmission paths. In this manner, no control line would be needed between the predistortion modulation signal generator and the multiplexer, as would be the case with the selection switch.

The predistortion modulation signal generator may be adapted to analyse the common feedback signal and to determine at least one common predistortion parameter. An analysis of the common feedback signal and a determination of the at least one common predistortion parameter may improve the predistortion performance for most or all of the plurality of transmission paths. The at least one common predistortion parameter may be a coefficient that is used for calculating the predistortion modulation signal.

The feedback loop may comprise a down-converter and an analogue-to-digital converter. A down-converter may be useful to convert the feedback signal from a RF range down to an intermediate frequency range or a base band range. The predistortion modulation signal generator may be adapted to accept the feedback signal within at least one of: the baseband frequency range and the intermediate frequency range. The analogue-to-digital converter processes the feedback signal to be suitable for subsequent signal processing. The bandwidth of the down-converter and the analogue-to-digital converter should be chosen in accordance with the expected bandwidth of non-linearity-related artefacts in the output signals of the plurality of transmission paths. The feedback loop may alternatively omit the downconversion stage described above and utilise a delta-sigma type of analogue-to-digital converter. Such a converter is able to process RF signals directly and to yield baseband signals suitable for subsequent processing.

The predistortion modulation signal generator may comprise an in-phase component path and a quadrature component path. The in-phase component path may be adapted to generate an in-phase component of the predistortion modulation signal, and the quadrature component path may be adapted to generate a quadrature component of the predistortion modulation signal. The predistortion modulation signal that comprises the in-phase component and the quadrature component is well suited for modulating the at least two transmission path signals of the plurality of the transmission path signals in terms of controlling the amplitude and/or the phase of the at least two transmission path signals.

The in-phase component path and the quadrature component path may each comprise a digital-to-analogue converter adapted to convert a digital in-phase modulation signal to an analogue in-phase modulation signal, and to convert a digital quadrature modulation signal to an analogue quadrature modulation signal. A generation of the predistortion modulation signal may be implemented digitally (i.e. the predistortion modulation signal generator would then be a digital circuit or the like). A digital generation of the predistortion modulation signal may be implemented on the DSP which may be present in the system for other reasons, already. The digital implementation offers a certain degree of flexibility and is usually much more accurate than a corresponding analogue implementation. On the other hand, the predistortion modulator is an analogue device because it is usually situated downstream of a digital-to-analogue converter in the transmission path. The digital-to-analogue converters in the in-phase component path and the quadrature component path are required only once, because the analogue predistortion modulation signal can be distributed to the plurality of transmission paths.

The predistortion modulator may be situated at a point within the transmission path at which the transmission path signal is modulated to one of: a radio frequency range and an intermediate frequency range. To be more precise, the predistortion modulation may be situated in a part of the transmission path in which the transmission path signal exists in one of the radio frequency range and the intermediate frequency range. Accordingly, the transmission path signal is already up-converted from the baseband to one of: the radio frequency range and the intermediate frequency range. Performing the predistortion modulation at the radio frequency range or the intermediate frequency range allows the predistortion modulation to concentrate on the non-linear behaviour of, for example, the amplifier. Any artefact produced by the up-converting process, such as intermodulation distortions, may be, for the most part, filtered out prior to the predistortion modulation, or the predistortion modulation signal may compensate for these as well.

The at least two of the plurality of transmission paths may further comprise a quadrature up-converter for modulating the transmission path signal with a local oscillator signal.

The predistortion modulator may further be adapted to modulate the transmission path signal with a local oscillator signal in order to upconvert the transmission path signal to one of: a radio frequency range or an intermediate frequency range. By adding a few components to the predistortion modulator it is possible to modulate the transmission path signal with two modulation signals, namely the predistortion modulation signal and the local oscillator signal. For example, if the predistortion modulator is a vector modulator, an additional mixer in the in-phase path of the predistortion modulator and another additional mixer in the quadrature path thereof would allow the injection of the local oscillator signal for upconverting the transmission path signal. In this manner, one signal combiner and one phase splitter can be economized per transmission path, compared to an arrangement with a separate predistortion modulator and a separate frequency-converting modulator.

The predistortion modulation signal in use may be composed of weighted even powers of the transmission path signal. The even powers of the transmission path signal are the square of the transmission path signal, the transmission path signal to the power of four, to the power of six, etc. Predistortion schemes, and in particular the so-called polynomial predistortion, rely on modifying the transmission path signal by applying a polynomial transform to the transmission path signal where the underlying polynomial usually comprises odd powers of the transmission path signal (cubic function of the transmission path signal, the transmission path signal to the power of five, etc.). In the context of the teachings disclosed herein the transmission path signal is modulated with the predistortion signal so that an odd-polynomial-predistortion may be achieved if the predistortion modulation signal comprises even powers of the transmission path signal. The predistortion modulation signal is usually a sum of weighted powers of the transmission path signal.

The predistortion signal in use may be generated using a look-up table on at least one of the plurality of transmission path signals. An instantaneous value of the transmission path signal(s) is used as an input for the look-up table. The look-up table provides the common predistortion modulation signal (or an intermediate signal in the process of generating the common predistortion modulation signal) at an output of the look-up table. The look-up table may provide for interpolation and/or extrapolation (linear interpolation/extrapolation, quadratic interpolation/extrapolation, cubic interpolation/extrapolation, spline-based interpolation/extrapolation, . . . ).

At least two of the plurality of transmission paths may comprise a digital-to-analogue converter and an up-converter adapted to frequency convert the transmission path signal.

The at least two of the plurality of transmission paths may comprise a delta-sigma modulator adapted to frequency converter the at least two transmission path signals. The teachings disclosed herein make the utilization of delta-sigma modulators possible for applications that require good linearity of the transmission paths and thus the application of some sort of predistortion. As mentioned above, many predistortion schemes require the transmission paths to have a large bandwidth that is much larger than the bandwidth of a payload signal alone. Delta-sigma modulators, although otherwise well suited for the applications at hand, would not qualify due to their usually limited bandwidth. The teachings disclosed herein make the utilization of such delta-sigma modulators possible in these cases, since the transmission paths are not concerned with carrying high-bandwidth predistortion signal components.

The present disclosure further provides a method for predistorting at least two of a plurality of transmission path signals in an active antenna array. The method comprises generating a common predistortion modulation signal; distributing the common predistortion modulation signal to the at least two of the plurality of transmission paths; and modulating the at least two of the plurality of transmission path signals with the common predistortion modulation signal to obtain at least two of a plurality of predistorted transmission path signals.

The method may further comprise at least one of the following features:
- vector modulating the at least two transmission path signals with the predistortion modulation signal;
- polar-coordinate-wise (i.e. amplitude and phase) modulating the at least two transmission path signals with the predistortion modulation signal;
- feeding a predistortion modulated signal to an amplifier and amplifying the predistortion modulated signal;
- feeding back an output of the plurality of transmission paths;
- as part of the feedback action: Merging feedback signals from at least one of the plurality of transmission paths to a common feedback signal;
- analysing the common feedback signal and determining at least one common predistortion parameter;
- as part of the feedback action: Down-converting the (common) feedback signal(s);
- analogue-to-digital converting the (common) feedback signal(s);
- digital-to-analogue converting the predistortion modulation signal, in particular an in-phase component and a quadrature component of the predistortion modulation signal;
- composing the predistortion modulation signal from weighted even powers of the transmission path signal.

The present disclosure further provides a computer program product involving a computer-readable medium and the computer-readable medium comprising executable instructions for the manufacture of an active antenna array as described herein.

The present disclosure also provides a computer program product comprising instructions that enable a processor to carry out the method as described herein.

As far as technically meaningful, the technical features disclosed herein may be combined in any manner. The active antenna array and the method for predistorting may be implemented in software, in hardware, or as a combination of both software and hardware.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect can be combined with a feature of a different aspect or aspects.

Figure 1:
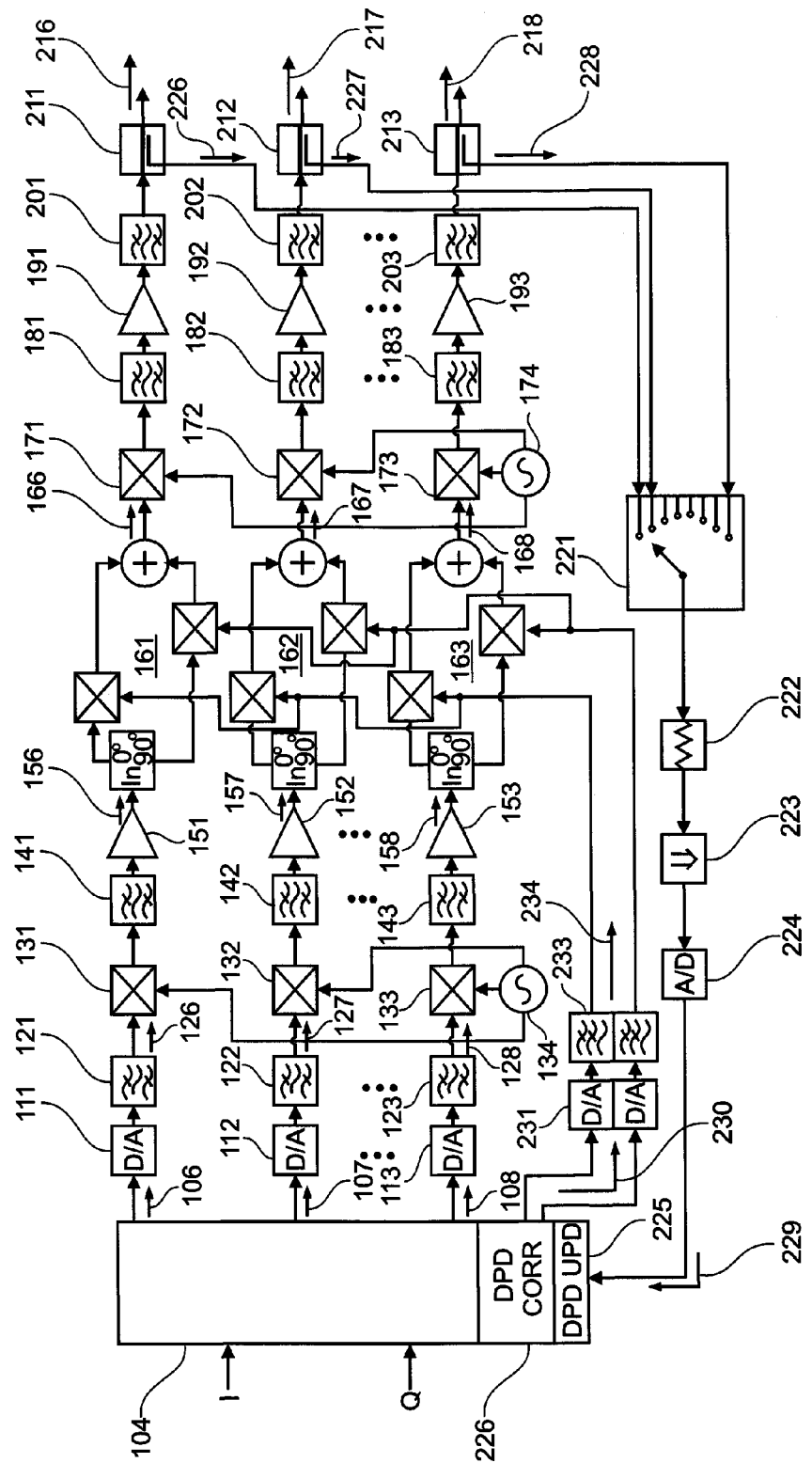
FIG. 1 shows an active antenna array with a vector-modulator based IF predistortion system with global feedback for coefficient updating, utilizing a sampling switch.

FIG. 1 shows a schematic block diagram of an active antenna array comprising a plurality of transmission paths. Only a first transmission path at the top, a second transmission path in the middle and a last or n'th transmission path at the bottom are illustrated in FIG. 1, as well as in the similar subsequent figures. The third, to the (n−1)'th, transmission paths are not illustrated for the sake of clarity.

A signal to be transmitted reaches the active antenna array from the left. In FIG. 1 the signal to be transmitted is illustrated as comprising an in-phase component I and a quadrature component Q. The signal to be transmitted may be present at a baseband frequency range, an intermediate frequency (IF) range or at a radio frequency (RF) range. In the configuration shown in FIG. 1 the signal to be transmitted is represented as a digital signal although this is not a requirement of the teaching disclosed herein. The signal to be transmitted is fed to a digital signal processor (DSP) 104. The DSP 104 distributes the signals to be transmitted to the plurality of transmission paths. In the example illustrated in FIG. 1 the signals to be transmitted by the plurality of transmission paths are digital IF transmission paths signals 106, 107 and 108. The digital IF transmission path signals 106, 107, 108 have, for example, undergone digital upconversion within the DSP.

The digital IF transmission path signals 106, 107, 108 are forwarded to digital-to-analogue converters 111, 112 and 113 on a per-transmission path basis. The analogue-to-digital converters 111, 112, 113 produce analogue transmission path signals which are forwarded to band-pass filters 121, 122 and 123 to produce filtered transmission path signals 126, 127 and 128.

In the active antenna array shown in FIG. 1 frequency conversion of the digital IF signals 106, 107, 108 to the RF range is achieved by a two-stage structure where the digital IF signals 106, 107, 108 are converted to produce the analogue transmission path signals and then to an intermediate frequency range before being up-converted to the RF range. For frequency conversion to the intermediate frequency the filtered transmission path signals 126, 127, 128 are forwarded to first stage mixers 131, 132, 133. The first stage mixers 131, 132, 133 modulate the filtered transmission path signals 126, 127, 128 by means of a local oscillator signal provided by a local oscillator 134. The frequency of the local oscillator signal is chosen in such a manner that the filtered transmission path signals 126, 127, 128 are frequency converted to a desired intermediate frequency. In order to filter out unwanted intermodulation products, intermediate frequency band-pass filters 141, 142 and 143 are provided at outputs of the mixers 131, 132, 133. Intermediate frequency amplifiers 151, 152, 153 produce amplified intermediate frequency signals 156, 157 and 158. Amplification at the intermediate frequency range is optional but may be beneficial for compensating for losses experienced in the previously described components.

The amplified IF transmission path signals 156, 157, 158 are forwarded to vector modulators 161, 162 and 163. The vector modulators 161, 162, 163 comprise a phase splitter (labelled "In" to mark an input of the phase splitter, and with "0°" and "90°" to mark two output terminals of the phase splitter). The vector modulators 161, 162, 163 further comprise two mixers or multipliers. One of the two mixers is connected to the 0°-output terminal of the phase splitter and the other mixer is connected to the 90°-output terminal of the phase splitter. The two mixers comprise further input terminals for a predistortion modulation signal 234. To be more precise, the mixers connected to the 0°-output terminals of the phase splitters receive an in-phase component of the predistortion modulation signal 234 at their respective further input terminals, and the mixers connected to the 90°-output terminals of the phase splitters receive a quadrature component of the predistortion modulation signal 234 at their further input terminal The terms "in-phase component" and "quadrature component" are only signal names and do not necessarily imply a particular phase relationship with any given signal(s) within the system. Each of the mixers produces a multiplication product of its respective input signals. Taking vector modulator 161 as an example, an in-phase multiplication product, produced by the mixer in the upper branch of vector modulator 161, and a quadrature multiplication product, produced by the mixer in the lower branch of vector modulator 161, are combined in a signal combiner. Predistorted transmission path signals 166, 167 and 168 are available at the output of the signal combiners of the vector modulators 161, 162, 163. A purpose of the vector modulators 161, 162, 163 is to predistort the filter transmission path signals 156, 157, 158 in such a manner that the resulting predistorted transmission path signals 166, 167, 168 compensate for a non-linear behaviour of the plurality of transmission paths, in particular power amplifiers, in subsequent portions of the transmission paths. This purpose is achieved by modulating the filtered transmission path signals 156, 157, 158 with the suitably generated predistortion modulation signal 234. The manner in which the predistortion modulation signal 234 may be generated will be described below.

The predistorted transmission path signals 166, 167, 168 are forwarded to second stage mixers 171, 172 and 173 for modulation with a second stage local oscillator signal produced by a local oscillator 174. Second stage filters 181, 182 and 183 filter the upconverted signals to remove unwanted intermodulation products. Outputs of the second stage filters 181, 182, 183 are connected to power amplifiers 191, 192 and 193 which often present a non-linear behaviour. Modern standards for mobile communications such as UMTS and LTE have relatively strict requirements regarding the linearity of transmitters and receivers in a mobile communications network operating using one of these standards. In the context of FIG. 1 the non-linear behaviour of the amplifiers 191, 192, 193 is compensated for by feeding the predistorted transmission path signals 166, 167, 168 to a signal input of the power amplifiers 191, 192, 193 (following upcoversion from IF to RF). Outputs of the amplifiers 191, 192, 193 are connected to transmission filters (Tx filters) 201, 202 and 203 to ensure a certain spectral mask of radiated signals 216, 217 and 218 of the active antenna array. The predistortion modulation signal 234 is generated by a portion of the DSP 104 (for example using FPGA firmware or circuits within a digital ASIC), by a software module executed by the DSP 104 or by a combination of both. The portion and/or the software module of the DSP 104 is indicated by reference sign 226 in FIG. 1. The DSP portion/software module receives a copy of the digital in-phase component I and of the digital quadrature component Q of the signal to be transmitted. Employing, for example, a model-based approach, the DSP portion/software module is capable of estimating the amount of distortion that the transmission path signals will experience due to the non-linearities in the transmission paths. This estimation of the influence of the non-linearities of the transmission paths leads to the determination of a digital predistortion modulation signal 230. The digital predistortion modulation signal 230 is a complex signal comprising an in-phase component and a quadrature component. A pair of digital-to-analogue converters 231 converts the digital predistortion modulation signal 230 to an analogue representation which is then filtered by a pair of predistortion signal low-pass filters 233 to remove any unwanted spectral portions from the analogue representation of the predistortion modulation signal. The predistortion modulation signal 234, as it is employed by the vector modulators 161, 162, 163, is available at an output of the pair of predistortion modulation signal low pass filters 233.

The digital predistortion modulation signal 230 may be generated in a variety of manners. "Classic" predistortion techniques rely on a polynomial-based approach in which the transmission path signal serves as an input or an independent variable for a polynomial. In classic predistortion the polynomial usually only has odd powers, i.e. $y=ax+bx^3+cx^5 \ldots$ (where a, b and c are real numbers, i.e. they can take both positive and negative values). It is also possible to use the polynomial-based approach in the context of the teachings of this disclosure. However, instead of the predistortion modulation signal 234 being based on odd powers of the transmission path signal(s), even powers of the transmission path signal(s) are employed. The reason is that the predistortion modulation signal 234 will be multiplied with the transmission path signals by means of the vector modulators 161, 162, 163, thereby creating an odd-order signal.

The generation of the digital predistortion modulation signal 230 may be controlled and optimized by adjusting coefficients of the underlying polynomial used for the generation of the digital predistortion modulation signal 230. In theory it might be possible to determine a set of optimal coefficients during the design or the manufacture of the active antenna array. This set of coefficients could then be programmed in the DSP portion/software module 226 and remain constant for practically the lifetime of the active antenna array. In reality, however, the non-linear behaviour of the transmission paths is likely to fluctuate over time, due to varying operating conditions such as temperature, load, aging of the components, etc. For these reasons, the active antenna array shown in FIG. 1 comprises a feedback path.

The feedback path comprises couplers or taps 211, 212 and 213 at or within at least some of the plurality transmission paths. The couplers 211, 212, 213 tap portions 226, 227 and 228 from the radiated signals 216, 217, 218. The tapped portions 226, 227, 228 are fed to a selection switch 221 which connects one of the tapped portions 226, 227, 228 with an output of the selection switch 221. The output of the selection switch 221 is connected to an attenuator 222 that is in turn connected to a down-convertor and optional filter 223.

An analogue-to-digital converter 224 converts an analogue representation of the down-converted selected one of the tapped portions 226, 227 or 228 to a digital representation of a feedback signal 229. The feedback signal 229 is forwarded to a DPD update portion or software module 225 that is part of the DSP 104. The DPD update portion/software module 225 compares the feedback signal 229 with the signal to be transmitted I, Q. Differences between the feedback signal 229 and the signal to be transmitted I, Q may indicate that a current setting of the predistortion is not yet optimal. The DPD update portion/software module 225 may analyze these differences and determine an improved setting for the predistortion, for example in the form of an updated set of coefficients for a predistortion polynomial. Note that in this example, the I and Q input signals to DSP 104 were used as the reference signals for comparison with the feedback signal; in the event that other signal processing takes place on these signals, within DSP 104 prior to transmission (for example crest-factor reduction or beamforming processing), then it is the processed signals which would be used for comparison purposes and not the input signals I, Q directly.

To summarize, FIG. 1 shows a sample view of the teachings of the present disclosure that uses IF vector modulation predistortion and a single (switched) feedback process. The basic architecture of each transmission path of the array is similar to that of a conventional dual (analogue)-upconversion transmitter system in which a digital IF output from the DSP is converted to an analogue IF signal. The analogue IF signal then undergoes two further stages of upconversion/filtering before arriving at the desired RF output frequency (at low power). In this system the predistortion process has moved from being entirely implemented digitally at baseband (i.e. within the DSP block) to the combined use of DSP (to generate correction signals) and an analogue IF vector modulator (to apply the correction to the already-modulated signal (s)).

The correction signals can either be based upon polynomial linearization or can make use of I and Q look-up tables (with suitable provisions for the correction of memory effect, in each case). Note that the required polynomials for look-up tables are slightly different to those used in conventional digital predistortion: in the case of polynomial predistortion, for example, $2^{nd}$, $4^{th}$, $6^{th}$, etc. orders are required in the (digital) polynomial, since these will become $3^{rd}$, $5^{th}$, $7^{th}$ etc. orders when multiplied with the modulated IF signals in the vector modulators 161, 162, 163.

Figure 2:
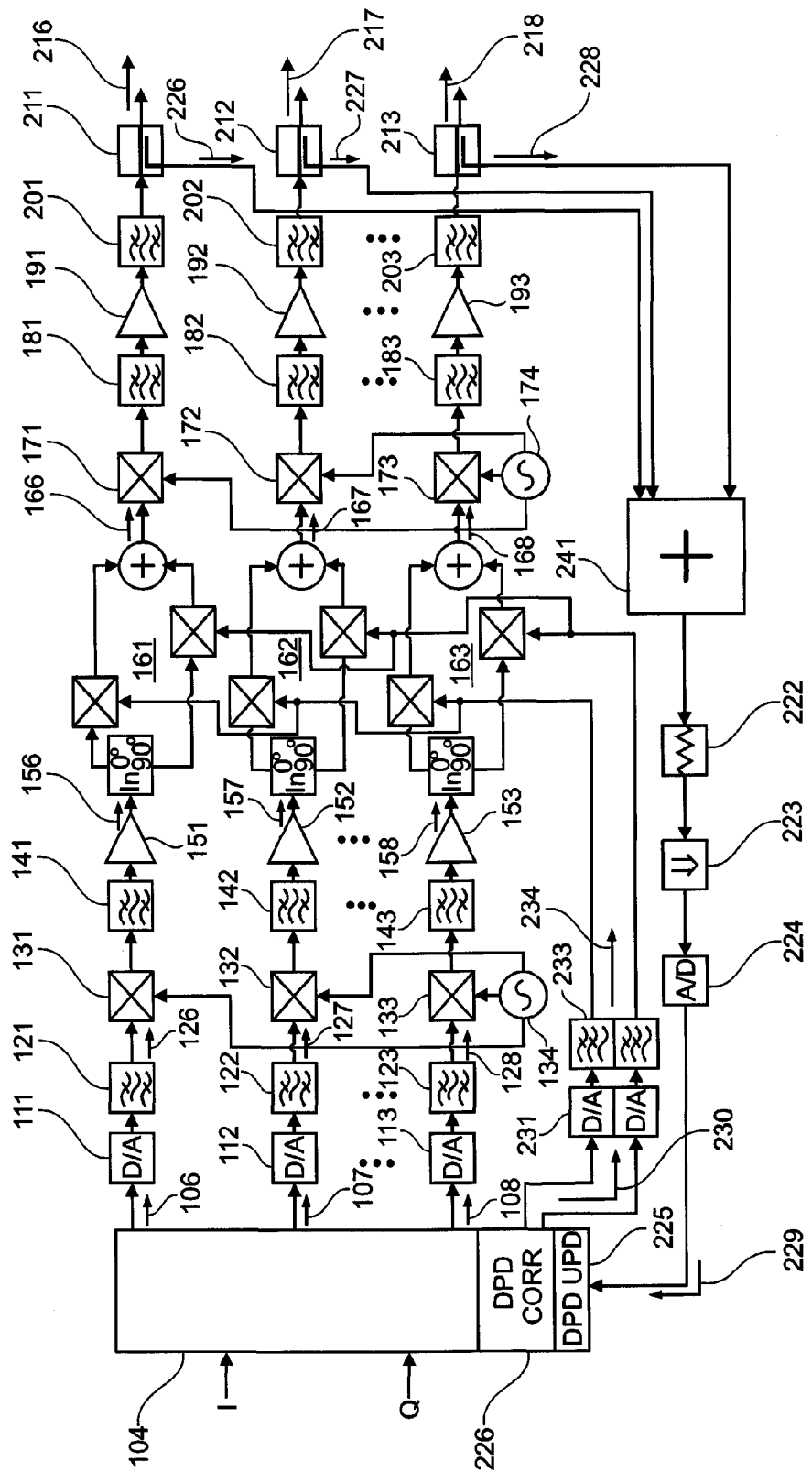
FIG. 2 shows an active antenna array with a vector-modulator based IF predistortion system with global feedback for coefficient updating, utilizing a feedback summation process.

FIG. 2 shows a schematic block diagram of an active antenna array with a pre-distortion modulation structure according to a second possible configuration. The active antenna array shown in FIG. 2 is substantially identical to the active antenna array shown in FIG. 1 with the exception of implementation of the feedback path. The selection switch 221 known from FIG. 1 has been replaced by a signal combiner 241. The signal combiner 241 delivers a (weighted) sum of the signals at its inputs. Compared to the selection switch 221 of FIG. 1 the signal combiner 241 does not require a control signal that indicates to the selection switch 221 which of its input signals should be currently selected. According to the teachings disclosed herein, a common pre-distortion modulation signal 234 is applied to several or all of the plurality of transmission paths. Under normal circumstances, the common pre-distortion modulation signal 234 performs equally well for all transmission paths to which the common pre-distortion modulation signal 234 is applied. Hence, a combined analysis of the feedback signals from the various transmission paths can be used because it is the overall linearity of the active antenna array that matters and not the linearity of the individual transmission paths. It would even be possible to provide only one of the couplers 211, 212, 213 and to remove the selection switch 221 or the signal combiner 241. The DPD update processing would then solely depend on a feedback signal from a single transmission path.

Figure 3:
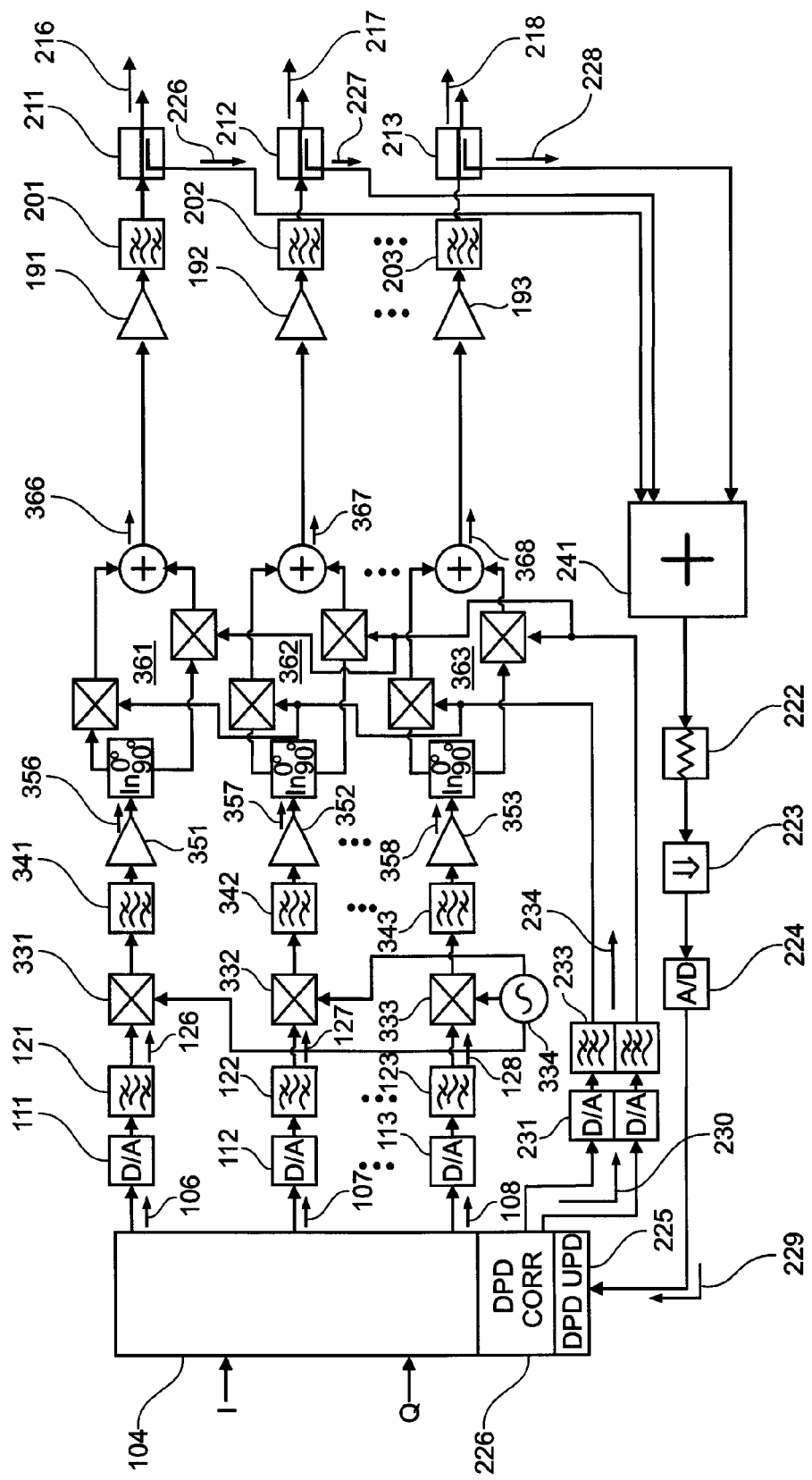
FIG. 3 shows an active antenna array with a vector-modulator based RF predistortion system with global feedback for coefficient updating, utilizing a feedback summation process.

FIG. 3 shows a further variant of the active antenna array, in this case using a single analogue upconversion process and an RF implementation of the vector modulator linearizer.

The mixers 131, 132, 133 shown in FIG. 1 have been replaced by RF mixers 331, 332, 333 which receive a local oscillator signal from a local oscillator 334. The local oscillator signal from local oscillator 335 is suitable for upconverting the digital IF transmission path signals 106, 107, 108 directly to the RF range. Mixers 331, 332, 333 are connected to RF band-pass filters 341, 342 and 343. RF amplifiers 351, 352 and 353 are connected to outputs of the RF band-pass filters 341, 342, 343 and produce amplified RF transmission path signals 356, 357 and 358.

Pre-distortion modulation is now performed at radio frequency by means of vector modulators 361, 362 and 363. The outputs of the vector modulators 361, 362, 363 are pre-distorted RF transmission path signals 366, 367, 368. From there, the processing continues as described with respect to FIGS. 1 and 2.

Figure 4:
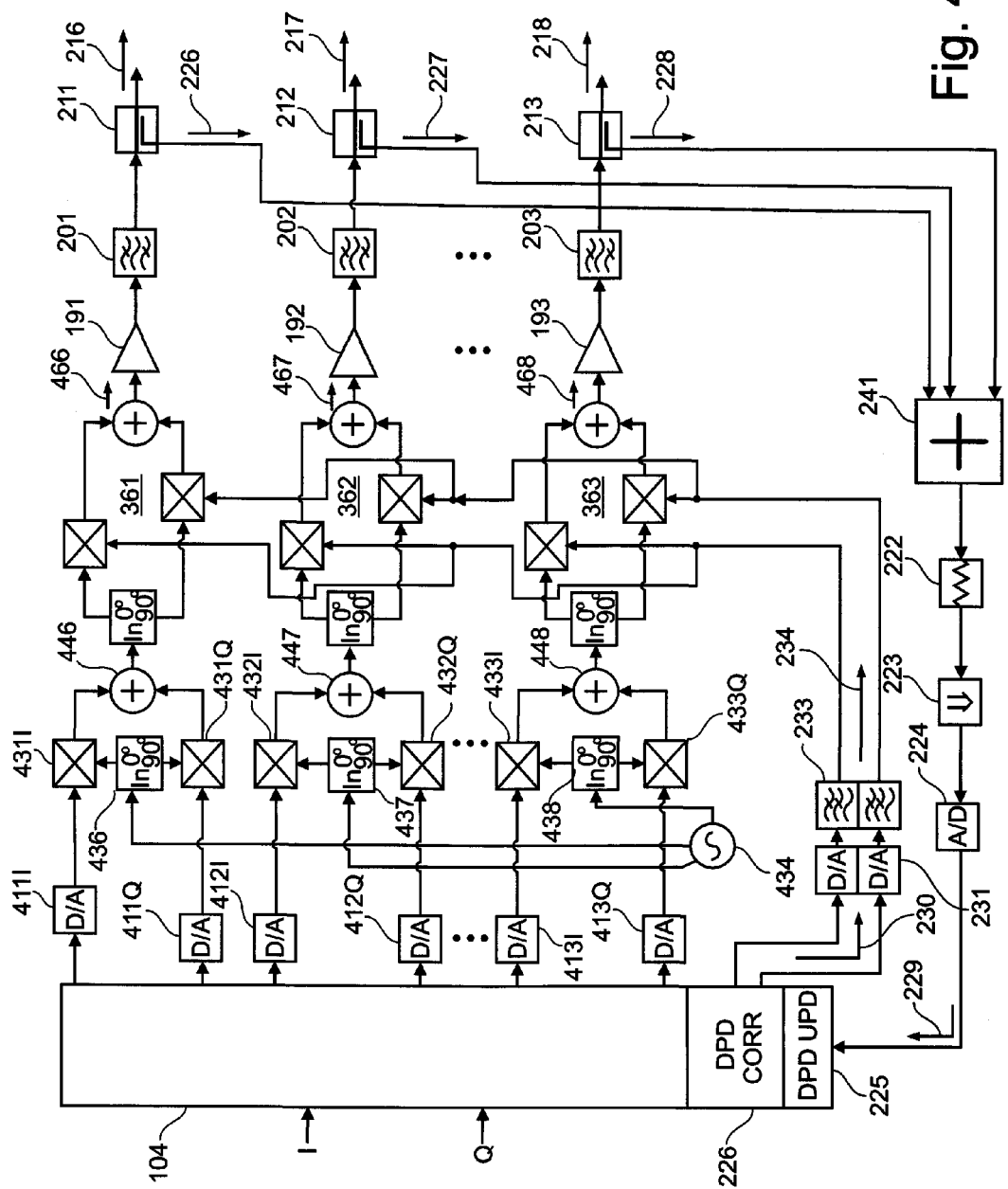
FIG. 4 shows an active antenna array with a vector-modulator based RF predistortion system with global feedback for coefficient updating, utilizing a feedback summation process (direct up-conversion).

FIG. 4 shows a schematic block diagram of an active antenna array with pre-distortion modulation for transmission path linearization according to a fourth possible configuration. The active antenna array shown in FIG. 4 incorporates direct upconversion, based on a standard quadrature upconversion process and I/Q analogue baseband signals from the two digital-to-analogue converters per transmission path. Again, the linearization process takes place at RF.

The digital base band transmission path signals produced by the DSP 104 are fed directly to a number of digital-to-analogue converters 411I, 411Q, 412I, 412Q, 413I and 413Q. The letter "I" as in "411I" stands for a component in the in-phase path of a signal processing structure for a complex signal. Likewise, the letter "Q" as in "411Q" indicates a component in a quadrature processing path of the processing structure for the complex signal. Following the digital-to-analogue converters 411I/Q, 412I/Q, 413FQ there is provided a plurality of quadrature modulators, one per transmission path. The quadrature modulators receive a local oscillator signal from a local oscillator 434 which is phase-split using phase splitters 436, 437 and 438. A 0° version of the local oscillator signal is fed to mixers 431I, 432I and 433I, respectively. A 90° version of the local oscillator signal is fed to mixers 431Q, 432Q and 433Q. Outputs of the mixers 431I/Q, 432I/Q, 433I/Q, are forwarded to signal combiners 446, 447 and 448. At this point the transmission path signals are upconverted to the RF range.

The upconverted RF transmission path signals are then forwarded to pre-distortion modulators 361, 362, 363 which are already known from FIG. 3. Pre-distorted transmission path signals 466, 467 and 468 leave the pre-distortion modulators 361, 362, 363 to be amplified by the amplifiers 191, 192, 193 known from FIG. 1. The remainder of FIG. 4 is identical or similar to FIGS. 1 to 3.

Figure 5:
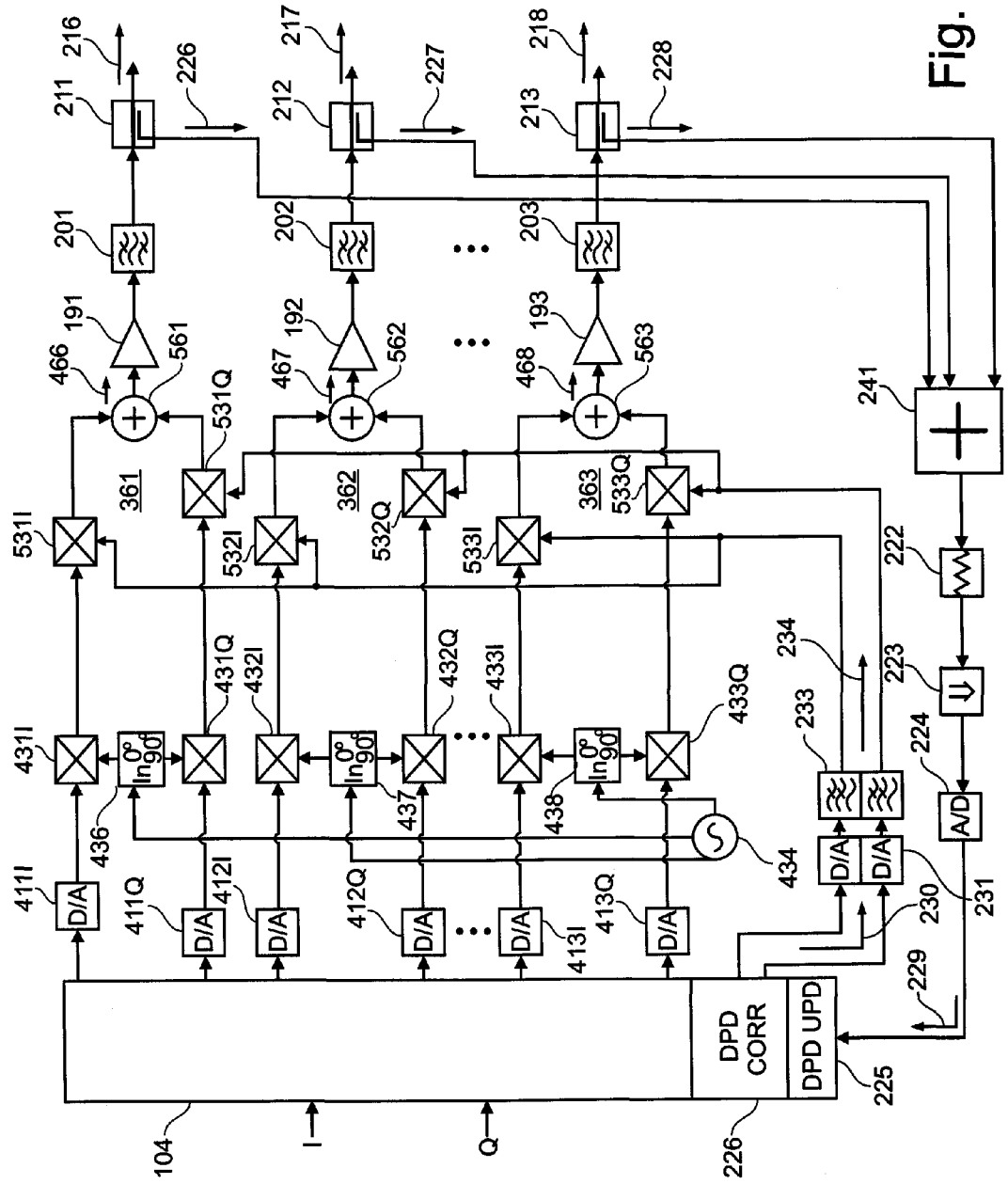
FIG. 5 shows an active antenna array with an alternative RF predistortion system with global feedback for coefficient updating, utilizing a feedback summation process (direct up-conversion).

FIG. 5 shows an alternative (simpler) version of the architecture shown in FIG. 4. In particular, the signal combiners 446, 447, 448 have been removed, as well as the phase splitters of the pre-distortion modulators 361, 362, 363. Instead, taking the uppermost transmission path as a representative example, the mixer 431I has been connected directly with a mixer 531I of the pre-distortion modulator 361. Likewise, the mixer 431Q has been connected directly with a mixer 531Q of the pre-distortion modulator 361. The same holds for the mixers 432I and 432Q which have been directly connected to mixers 532I and 532Q belonging to pre-distortion modulator 362. For the n'th transmission path the mixer 433I is now directly connected to a mixer 533I of the pre-distortion modulator 363, and the mixer 433Q is now directly connected to a mixer 533Q of the pre-distortion modulator 363.

Compared to the architecture shown in FIG. 4, the architecture proposed in FIG. 5 saves two elements per transmission path. This may be of interest for cost reasons and/or for reasons of signal quality and accuracy within the plurality of transmission paths. The transmission path signals suffer less attenuation and a lower phase and amplitude inaccuracy. Note that whilst this is simpler from a block-diagram perspective, it may not be simpler in implementation, due to the widespread availability of integrated circuits performing quadrature upconversion and/or vector modulator functions.

In the transmission paths, the in-phase component and the quadrature component are combined by means of signal combiners 561, 562 and 563. The remainder of FIG. 5 is similar to that shown in FIGS. 1-4.

Figure 6:
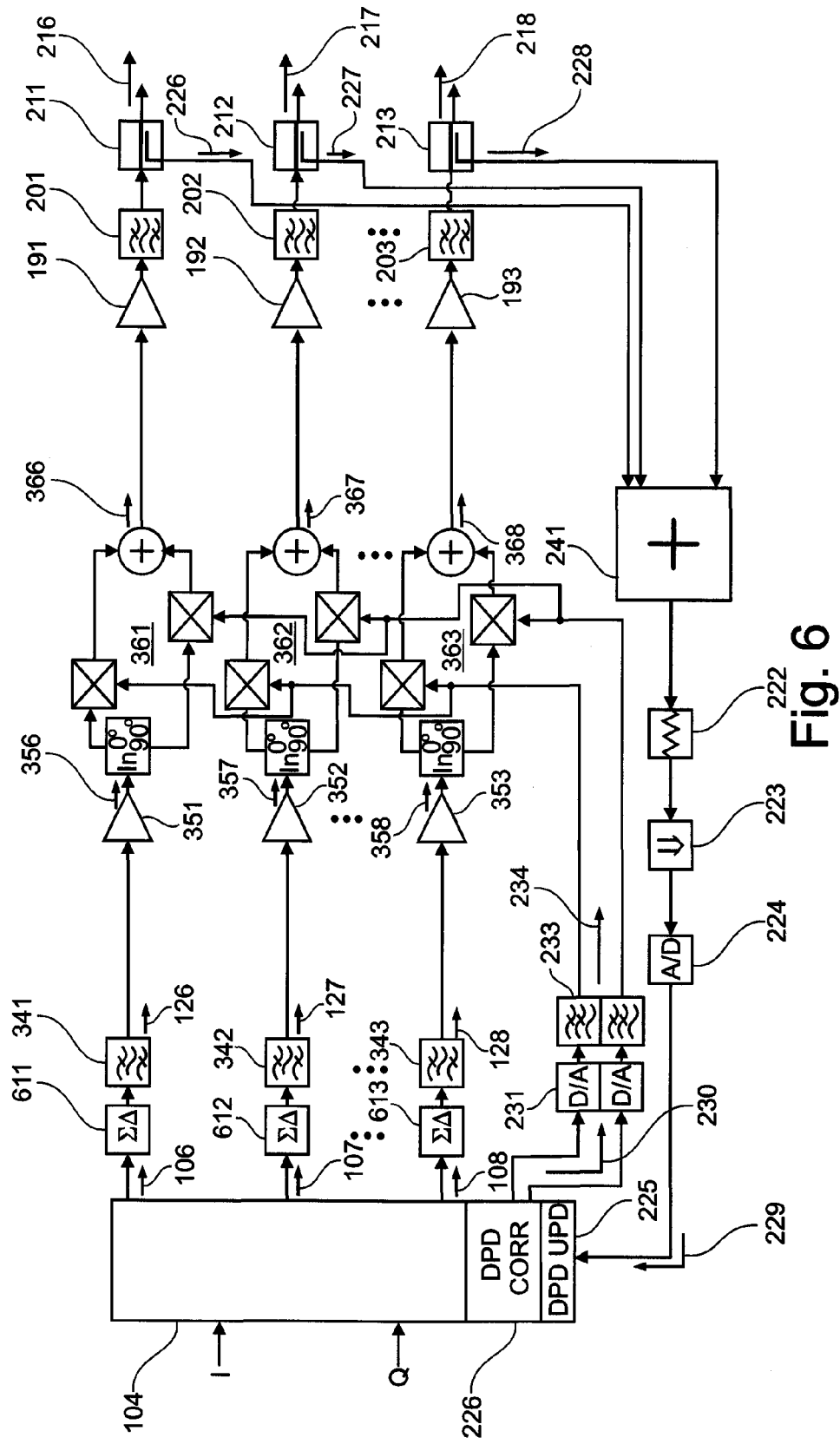
FIG. 6 shows an active antenna array with an alternative RF predistortion system with global feedback for coefficient updating, utilizing a feedback summation process (delta-sigma DACs).

FIG. 6 shows an equivalent architecture to FIG. 3, i.e. a direct RF output, but this time employing a delta-sigma DAC for each transmission path. The linearization process takes place at RF.

In the active antenna array shown in FIG. 3, the upconversion of the digital IF transmission path signals 106, 107, 108 is performed by means of mixers 331, 332, 333 in the plurality of transmission paths. The mixers 331, 332, 333 mix the transmission path signals with the local oscillator signal provided by local oscillator 334. Digital-to-analogue conversion is performed by standard digital-to-analogue converters 111, 112, 113. The baseband band-pass filters 121, 122, 123 remove unwanted spectral components of the analogue baseband transmission path signals, such as quantization noise produced by the digital-to-analogue converters 111, 112, 113. These components have been replaced in the active antenna array shown in FIG. 6 by delta-sigma modulators 611, 612 and 613. The delta-sigma modulators 611-613 perform a digital-to-analogue conversion as well as a frequency upconversion to radio frequency. Note that the delta-sigma modulators 611, 612, 613 are only required to provide sufficient bandwidth for the transmission path signals, but are not required to provide bandwidth for pre-distortion-related components of the transmission path signals because of the subsequent pre-distortion modulation as performed by the pre-distortion modulators 361 to 363. This can reduce the bandwidth requirements placed upon these converters by two-thirds or more when compared to a conventional digital predistortion solution.

Figure 7:
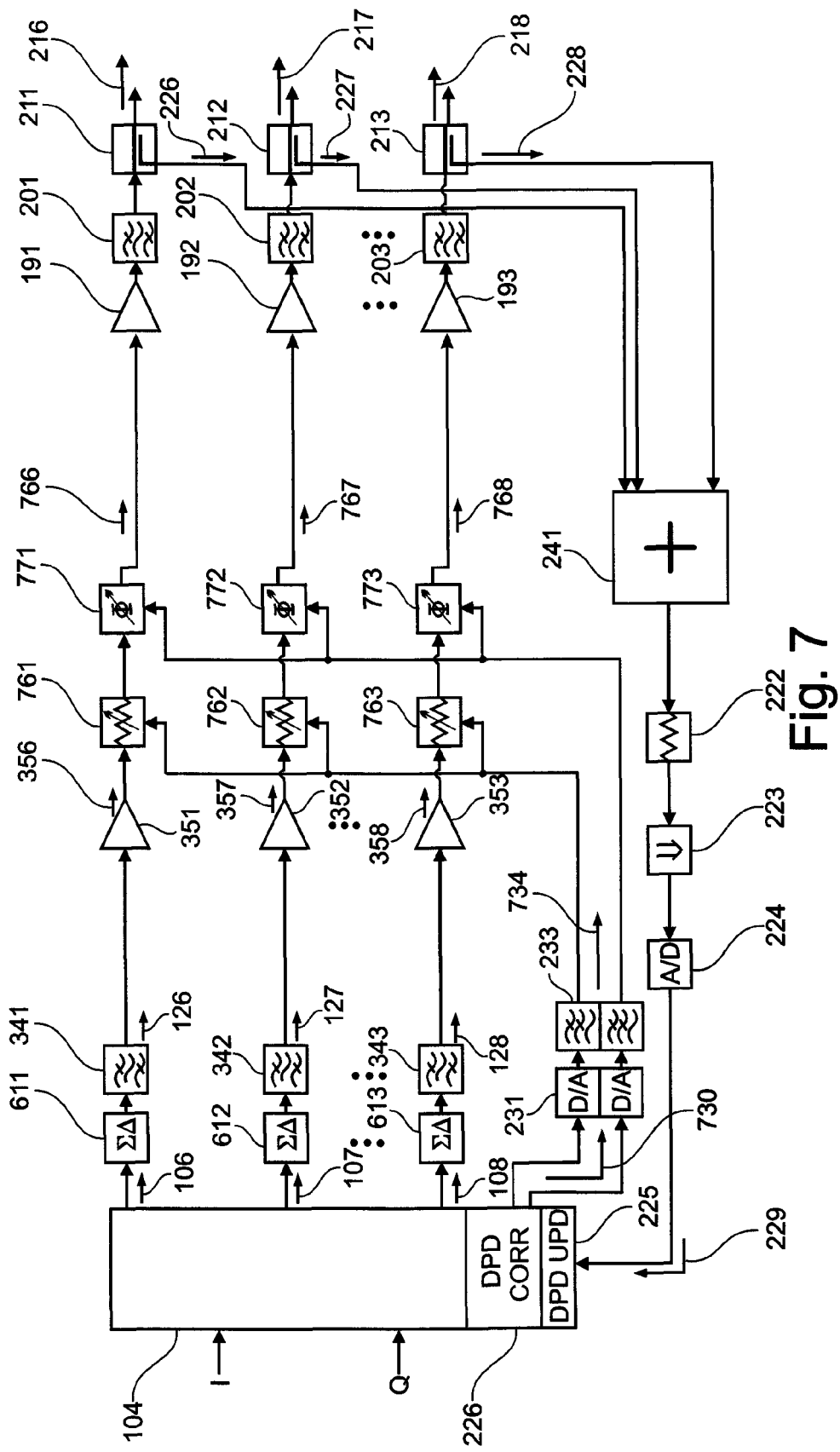
FIG. 7 shows an active antenna array with delta-sigma DACs and an RF predistortion system incorporating: gain/phase (polar) correction in place of vector modulator (Cartesian) correction.

FIG. 7 shows an alternative version of FIG. 6, in which the pre-distortion modulators 361-363 have been replaced by gain controllers 761, 762, 763 and phase controllers 771, 772, 773. The gain controllers (or variable gain elements) could be implemented in various ways, e.g.: variable attenuators, variable gain amplifiers, multipliers etc., and the phase controllers (or variable phase-shifts) could be implemented in a number of ways, e.g.: quad-hybrid phase-shift, variable delay elements, simple varactor-based phase shifter etc. This architecture is a polar equivalent solution of the Cartesian (vector-modulator) based solution(s) described so far. It operates in the same way and can use both polynomial or look-up table based pre-distortion techniques, in a similar manner to the Cartesian variants. The difference is that the signal is treated as a polar signal, i.e. the pre-distortion signals are now derived and applied in amplitude and phase (in the DPD update processing and DPD correction signal generation blocs respectively) and not in I and Q form as they were previously.

The DPD correction block/software module 226 produces a polar pre-distortion modulation signal in digital representation. The pair of digital-to-analogue converters 231 and the pair of pre-distortion modulation signal low-pass filters 233 transform the digital representation of the polar pre-distortion modulation signal into an analogue representation of the pre-distortion modulation signal 734. An amplitude component of the pre-distortion modulation signal 734 is fed to the gain controllers 761, 762, 763. A phase component of the pre-distortion modulation signal 734 is fed to the phase controllers 771, 772, 773. The modulation of the amplitude and the phase of the transmission path signals 356, 357, 358 produces pre-distorted transmission path signals 766, 767 and 768.

Figure 8:
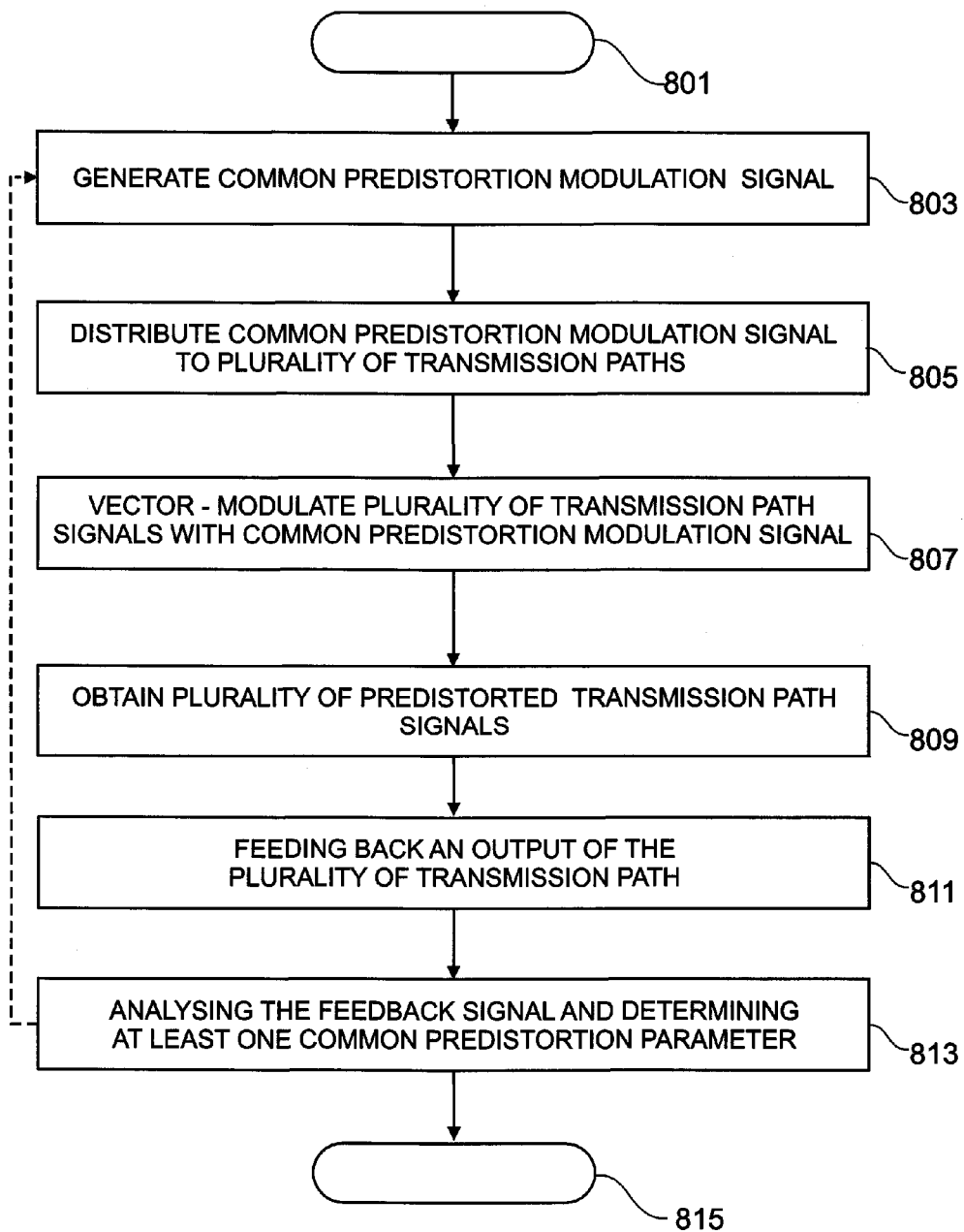
FIG. 8 shows a flow chart of a method for predistorting according to the teachings disclosed herein.

FIG. 8 shows a flow chart of a method for pre-distorting according to the teachings disclosed herein. The method starts at a block 801 and proceeds to a block 803 where a common pre-distortion modulation signal is generated. At block 805 the common pre-distortion modulation signal is distributed to a plurality of transmission paths. This distribution may optionally comprise adjustments to the amplitude and/or the phase depending upon which of the plurality of transmission paths the common pre-distortion modulation signal is distributed to. In this manner, the distribution of the common pre-distortion modulation signal takes into account desired and/or predetermined phase differences and amplitude differences between the plurality of transmission paths which may have been provided in order to cause the active antenna array to form a certain beam pattern or beam direction.

At block 807 the plurality of transmission path signals are vector modulated with the common pre-distortion modulation signal. Instead of vector-modulating, other types of modulation may be used, such as a modulation in the polar plane, i.e. modulating an amplitude and a phase of the transmission path signals with a polar representation of the common pre-distortion modulation signal. At block 809 a plurality of pre-distorted transmission path signals is obtained.

At an optional action 811 an output of the plurality of transmission path signals is fed back, as a feedback signal, to a DPD module (reference sign 226 in FIGS. 1 to 7). The feedback signal is analysed and at least one common predistortion parameter is determined at 813. The at least one common predistortion parameter is used in the action 803 of generating the common predistortion signal, which is illustrated in FIG. 8 by the dashed line between the blocks 813 and 803. The method ends at block 815.

It should be noted that the various actions of the method for pre-distorting may in fact be performed concurrently at various places of the active antenna array.

While various embodiments of the present invention have been described above, it should be understood that they have been presented by way of example, and not limitation. It will be apparent to persons skilled in the relevant arts that various changes in form and detail can be made therein without departing from the scope of the invention. In addition to using hardware (e.g., within or coupled to a central processing unit ("CPU"), micro processor, micro controller, digital signal processor, processor core, system on chip ("SOC") or any other device), implementations may also be embodied in software (e.g. computer readable code, program code, and/or instructions disposed in any form, such as source, object or machine language) disposed for example in a computer useable (e.g. readable) medium configured to store the software. Such software can enable, for example, the function, fabrication, modelling, simulation, description and/or testing of the apparatus and methods describe herein. For example, this can be accomplished through the use of general program languages (e.g., C, C++), hardware description languages (HDL) including Verilog HDL, VHDL, and so on, or other available programs. Such software can be disposed in any known computer useable medium such as semiconductor, magnetic disc, or optical disc (e.g., CD-ROM, DVD-ROM, etc.). The software can also be disposed as a computer data signal embodied in a computer useable (e.g. readable) transmission medium (e.g., carrier wave or any other medium including digital, optical, analogue-based medium). Embodiments of the present invention may include methods of providing the apparatus described herein by providing software describing the apparatus and subsequently transmitting the software as a computer data signal over a communication network including the internet and intranets.

It is understood that the apparatus and method describe herein may be included in a semiconductor intellectual property core, such as a micro processor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. An active antenna array comprising:
    a plurality of transmission paths, wherein at least two of the plurality of transmission paths each comprise a predistortion modulator for modulating a transmission path signal with a common predistortion modulation signal,
    a predistortion modulation signal generator for generating the common predistortion modulation signal;
    a predistortion modulation signal distribution structure adapted to receive the common predistortion modulation signal from the predistortion modulation signal generator and to distribute the common predistortion modulation signal to each of the predistortion modulators of the at least two of the plurality of transmission paths.

2. The active antenna array according to claim 1, wherein the predistortion modulator is one of a vector modulator and a polar modulator.

3. The active antenna array according to claim 1, wherein the at least two of the plurality of transmission paths comprise an amplifier and wherein the predistortion modulator is situated upstream of the amplifier.

4. The active antenna array according to claim 1, further comprising
    a feedback loop, connected to an output of the plurality of transmission paths and to the predistortion modulation signal generator.

5. The active antenna array according to claim 4, wherein the feedback loop comprises a merging unit connected to the output of the plurality of transmission paths and adapted to merge feedback signals from at least two of the plurality of transmission paths to a common feedback signal.

6. The active antenna array according to claim 5, wherein the merging unit is one of an additive signal combiner, a selection switch, and a multiplexer.

7. The active antenna array according to claim 5, wherein the predistortion modulation signal generator is adapted to analyze the common feedback signal and to determine at least one common predistortion parameter.

8. The active antenna array according to claim 4, wherein the feedback loop comprises a downconverter and an analogue-to-digital converter.

9. The active antenna array according to claim 1, wherein the predistortion modulation signal generator comprises an in-phase component path and a quadrature component path, the in-phase component path being adapted to generate an in-phase component of the predistortion modulation signal, and the quadrature component path being adapted to generate a quadrature component of the predistortion modulation signal.

10. The active antenna array according to claim 9, wherein the in-phase component path and the quadrature component path each comprise a digital-to-analogue converter adapted to convert a digital in-phase modulation signal into an analogue in-phase modulation signal, and to convert a digital quadrature modulation signal into an analogue quadrature modulation signal.

11. The active antenna array according to claim 1, wherein the predistortion modulator is situated at a point within the transmission path at which the transmission path signal is modulated to one of a radio frequency range and an intermediate frequency range.

12. The active antenna array according to claim 1, wherein the at least two of the plurality of transmission paths further comprise a quadrature upconverter for modulating the transmission path signal with a local oscillator signal.

13. The active antenna array according to claim 1, wherein the predistortion modulator is further adapted to vector-modulate the transmission path signal with a local oscillator signal in order to frequency modulate the transmission path signal to one of a radio frequency range or an intermediate frequency range.

14. The active antenna array according to claim 1, wherein the predistortion modulation signal in use is composed of weighted even powers of the transmission path signal.

15. The active antenna array according to claim 1, wherein the predistortion modulation signal in use is generated using of a look-up table on at least one of the plurality of transmission path signals.

16. The active antenna array according to claim 1, wherein the at least two of the plurality of transmission paths comprise a digital-to-analogue converter and an upconverter adapted to frequency convert the transmission path signal.

17. The active antenna array according to claim 1, wherein the at least two of the plurality of transmission paths comprise a delta-sigma modulator adapted to frequency convert the transmission path signal.

18. A method for predistorting at least two of a plurality of transmission path signals in an active antenna array, the method comprising the steps of:
    generating a common predistortion modulation signal;
    distributing the common predistortion modulation signal to at least two of plurality of transmission paths each carrying a transmission path signal,
    modulating the transmission path signals of the at least two of the plurality of transmission paths with the common predistortion modulation signal to obtain at least two of a plurality of predistorted transmission path signals.

19. A computer program product embodied on a non-transitory computer readable medium comprising instructions that enable a processor to carry out a method comprising the steps of:
    generating a common predistortion modulation signal;
    distributing the common predistortion modulation signal to at least two of a plurality of transmission paths each carrying a transmission path signal, modulating the transmission path signals of the at least two of the plurality of transmission paths with the common predistortion modulation signal to obtain at least two of a plurality of predistorted transmission path signals.

* * * * *